US008785219B1

(12) United States Patent
Yu et al.

(10) Patent No.: US 8,785,219 B1
(45) Date of Patent: Jul. 22, 2014

(54) OPTOELECTRONIC SEMICONDUCTOR DEVICE AND THE MANUFACTURING METHOD THEREOF

(71) Applicants: Tz Chiang Yu, Hsinchu (TW); Jenn Hwa Fu, Hsinchu (TW); Hsin Hsiung Huang, Hsinchu (TW)

(72) Inventors: Tz Chiang Yu, Hsinchu (TW); Jenn Hwa Fu, Hsinchu (TW); Hsin Hsiung Huang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/219,490

(22) Filed: Mar. 19, 2014

Related U.S. Application Data

(63) Continuation of application No. 13/747,593, filed on Jan. 23, 2013, now Pat. No. 8,716,743.

(60) Provisional application No. 61/593,896, filed on Feb. 2, 2012.

(51) Int. Cl.

| | |
|---|---|
| ***H01L 21/00*** | (2006.01) |
| ***H01L 31/18*** | (2006.01) |
| ***H01L 33/62*** | (2010.01) |

(52) U.S. Cl.
CPC ................ *H01L 33/62* (2013.01); *H01L 31/18* (2013.01)
USPC ...... 438/22; 438/627; 438/653; 257/E33.063; 257/E31.125

(58) Field of Classification Search
CPC .... H01L 33/36; H01L 33/40; H01L 21/76856
USPC .................... 438/22, 627, 653; 257/E31.125, 257/E33.063
See application file for complete search history.

(56) References Cited

U.S. PATENT DOCUMENTS

| | | | | |
|---|---|---|---|---|
| 8,324,639 | B2 * | 12/2012 | Fudeta et al. | 257/93 |
| 2012/0228664 | A1 * | 9/2012 | Terano et al. | 257/99 |
| 2013/0001784 | A1 * | 1/2013 | Cabral et al. | 257/751 |
| 2013/0065351 | A1 * | 3/2013 | Baker-O'Neal et al. | 438/72 |

* cited by examiner

*Primary Examiner* — Minh-Loan T Tran
(74) *Attorney, Agent, or Firm* — Ditthavong & Steiner, P.C

(57) ABSTRACT

The present application provides a method of manufacturing an optoelectronic semiconductor device, comprising the steps of: providing a substrate; forming an optoelectronic system on the substrate; forming a barrier layer on the optoelectronic system; forming an electrode on the barrier layer; and annealing the optoelectronic semiconductor device; wherein the optoelectronic semiconductor device has a first forward voltage before the annealing step and has a second forward voltage after the annealing step, and a difference between the second forward voltage and the first forward voltage is smaller than 0.2 Volt.

17 Claims, 6 Drawing Sheets

107
110
109
104
103
106
102
101

OPTOELECTRONIC SEMICONDUCTOR DEVICE AND THE MANUFACTURING METHOD THEREOF

CROSS REFERENCE TO RELATED APPLICATION

This application is a continuation application of U.S. patent application Ser. No. 13/747,593, entitled "OPTO-ELECTRONIC SEMICONDUCTOR DEVICE AND THE MANUFACTURING METHOD THEREOF", filed on Jan. 23, 2013, now, which claims the benefit of priority to U.S. Provisional Application Ser. No. 61/593,896 field Feb. 2, 2012, the contents of which is incorporated by reference herein in its entirety.

TECHNICAL FIELD

The application relates to an optoelectronic semiconductor device and the manufacturing method thereof.

BACKGROUND

The forward voltage ($V_f$) of the nitride optoelectronic semiconductor device is normally increased after annealing with a high temperature (>150° C.). The main factor causes the above phenomenon is the characteristic of the contact between n-type GaN layer and n-type electrode.

SUMMARY

The present application provides a method of manufacturing an optoelectronic semiconductor device, comprising the steps of: providing a substrate; forming an optoelectronic system on the substrate; forming a barrier layer on the opto-electronic system; forming an electrode on the barrier layer; and annealing the optoelectronic semiconductor device; wherein the optoelectronic semiconductor device has a first forward voltage before the annealing step and has a second forward voltage after the annealing step, and a difference between the second forward voltage and the first forward voltage is smaller than 0.2 Volt.

BRIEF DESCRIPTION OF THE DRAWING

The foregoing aspects and many of the attendant advantages of this application are more readily appreciated as the same become better understood by reference to the following detailed description, when taken in conjunction with the accompanying drawings, wherein.

DETAILED DESCRIPTION OF PREFERRED EMBODIMENTS

Figure 1:
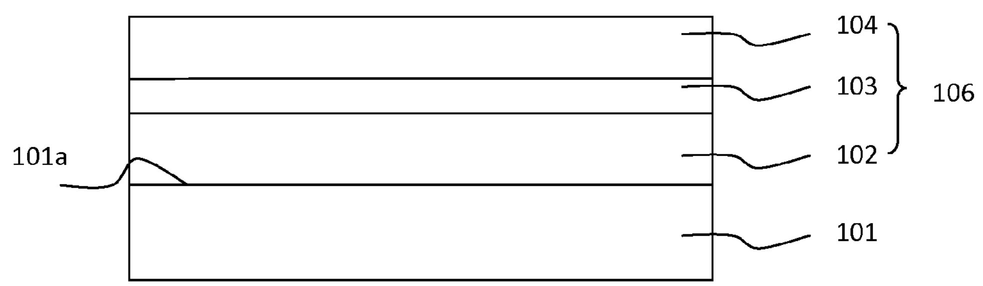
FIG. 1 through FIG. 5 are schematic diagrams showing the process flow for manufacturing an optoelectronic semiconductor device in accordance with a first embodiment of the present application.

Referring to FIG. 1, the application provides a conductive substrate 101 for growing or carrying an optoelectronic system 106, and the suitable material of the substrate 101 includes but is not limited to SiC, GaAs, GaN, MN, GaP, Si, Cu, Ge or the combination thereof.

Following, an optoelectronic system 106 including a first conductivity type layer 102, a conversion unit 103, and a second conductivity type layer 104 is formed on the first surface 101*a* of the substrate 101. The first conductivity type layer 102 and the second conductivity type layer 104 are two single-layer structures or two multiple layers structures ("multiple layers" means two or more than two layers) having different electrical properties, polarities, dopants for providing electrons or holes respectively. If the first conductivity type layer 102 and the second conductivity type layer 104 are composed of the semiconductor materials, the conductivity type can be composed of any two of p-type, n-type, and i-type. The conversion unit 103 disposed between the first conductivity type layer 102 and the second conductivity type layer 104 is a region where the light energy and the electrical energy could exchange or could be induced to exchange. Specifically speaking, the optoelectronic system can be a light-emitting diode (LED), a laser diode (LD), an organic light-emitting diode, a liquid crystal display, a solar cell, or a photo diode. The conversion unit 103 transferring the electrical energy to the light energy forms a part of a light-emitting diode, a liquid crystal display, or an organic light-emitting diode. The conversion unit 103 transferring the light energy to the electrical energy forms a part of a solar cell or a photo diode. The phrase "optoelectronic system" in the specification does not require that all the sub-systems or units in the system be manufactured by semiconductor materials. Other non-semiconductor materials such as metal, oxide, insulator, and so on could also be selectively integrated in this optoelectronic system.

Taking the light-emitting diode as an example, the emission spectrum of the transferred light could be adjusted by changing the physical or chemical arrangement of one layer or more layers in the optoelectronic system. The commonly used materials contain one or more elements selected from the group consisting of Ga, Al, In, As, P, N, and Si. The conversion unit can be a single heterostructure (SH), a double heterostructure (DH), a double-side double heterostructure (DDH), or a multi-quantum well (MQW) structure. Besides, the wavelength of the emitted light could also be adjusted by changing the number of the pairs of the quantum well in a MQW structure.

A transition layer (not shown) could be optionally formed between the substrate 101 and the optoelectronic system 106. The transition layer between two material systems can be used as a buffer system. For the structure of the light-emitting diode, the transition layer is used to reduce the lattice mismatch between two material systems. On the other hand, the transition layer could also be a single layer, multiple layers, or a structure to combine two materials or two separated structures where the material of the transition layer can be organic, inorganic, metal, semiconductor, and so on, and the structure can be a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on. Furthermore, the light-emitting diode structure is separated from a growth substrate (not shown) for growing the optoelectronic system 106, and bonded to the substrate 101.

Figure 2:
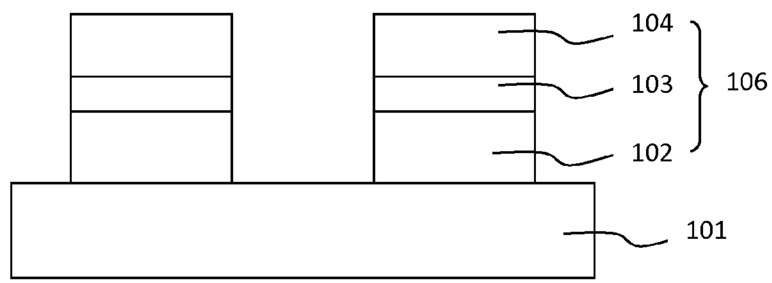
Figure 3:
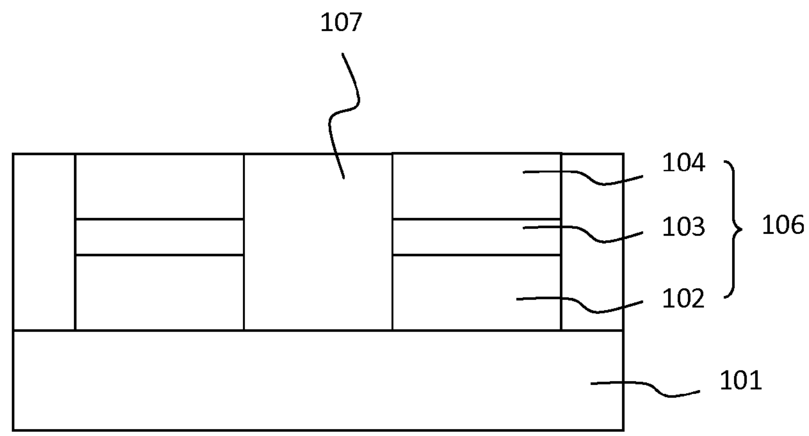
Figure 4:
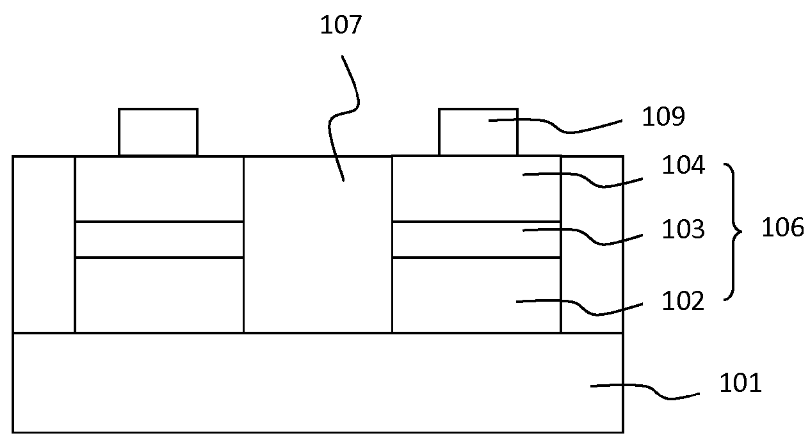
Figure 5:
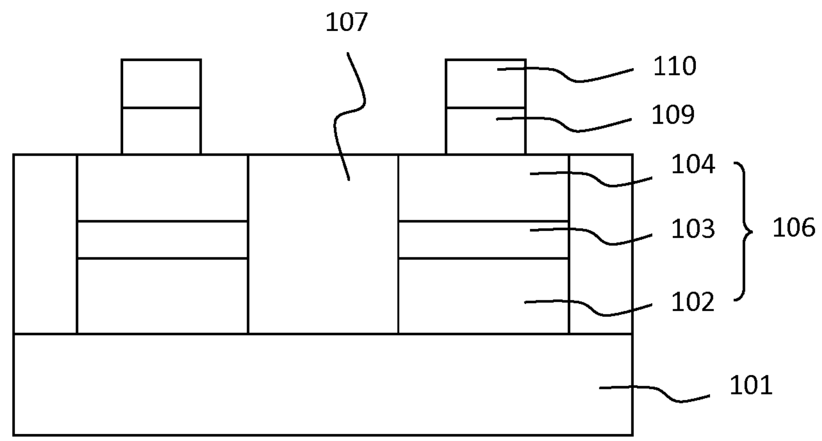

Referring to FIG. 2, the optoelectronic system 106 is patterned by etching a portion of optoelectronic system 106. In one embodiment, it can be etched by inductively coupled plasma reactive ion etching (ICP-RIE). Following, referring to FIG. 3, a passivation layer 107 is formed on the area where the optoelectronic system 106 etched. The material of the passivation layer 107 can be single metal oxides such as $TiO_2$ or $SiO_2$, complex oxides such as $BaTiO_3$, $Sr_2Nb_2O_7$, or $Pb(Zr_{0.52}Ti_{0.48})O_3$, or non-conductive compound nitrides such as $SiN_8$. Referring to FIG. 4, a barrier layer 109 is formed on the optoelectronic system 106. The barrier layer 109 comprises metal nitride such as TiNx. The method forming the barrier layer 109 is physical vapor phase deposition (PVD), including thermal evaporation deposition, plasma sputtering deposition, e-gun deposition, and ion beam sputtering deposition. Referring to FIG. 5, an electrode 110 is formed on the barrier layer 109. The material of the electrode 110 can be metal material such as Cr, Ti, Ni, Pt, Cu, Au, Al, or Ag.

Figure 6:
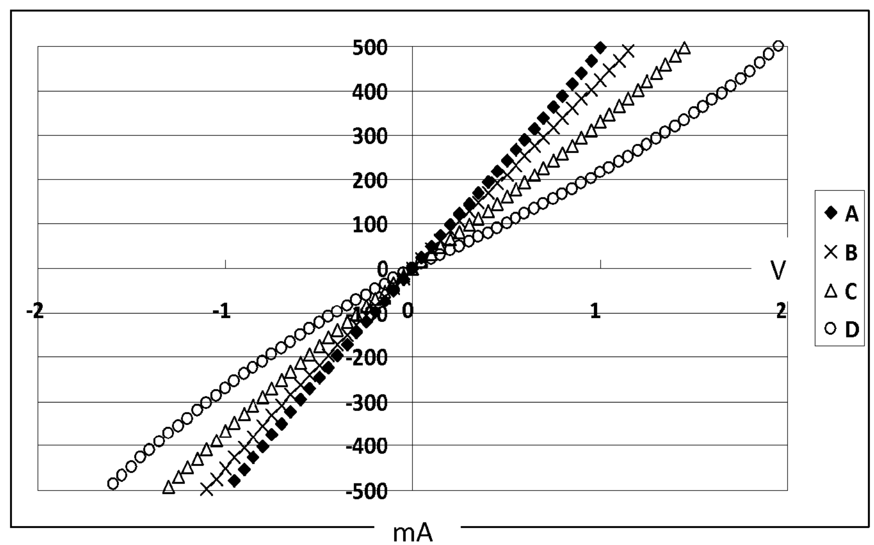
FIG. 6 is a schematic diagram showing an I-V curve of an optoelectronic semiconductor device with different thickness of the barrier layer in accordance with a first embodiment of the present application.

FIG. 6 shows an I-V curve of an optoelectronic semiconductor device with different thickness of the barrier layer 109. In present embodiment, the barrier layer 109 is TiN. The optoelectronic semiconductor device does not anneal after the barrier layer is formed. The thickness of the barrier layer in Sample A is 0, which means virtually no barrier layer 109 formed on the optoelectronic system 106. The thicknesses of the barrier layers in Sample B, C, D are 10 angstroms, 30 angstroms, and 56 angstroms, respectively. The contact resistance between the electrode 110 and the optoelectronic system 106 of the optoelectronic semiconductor device is increased as the thickness of the barrier layer 109 increased.

Figure 7:
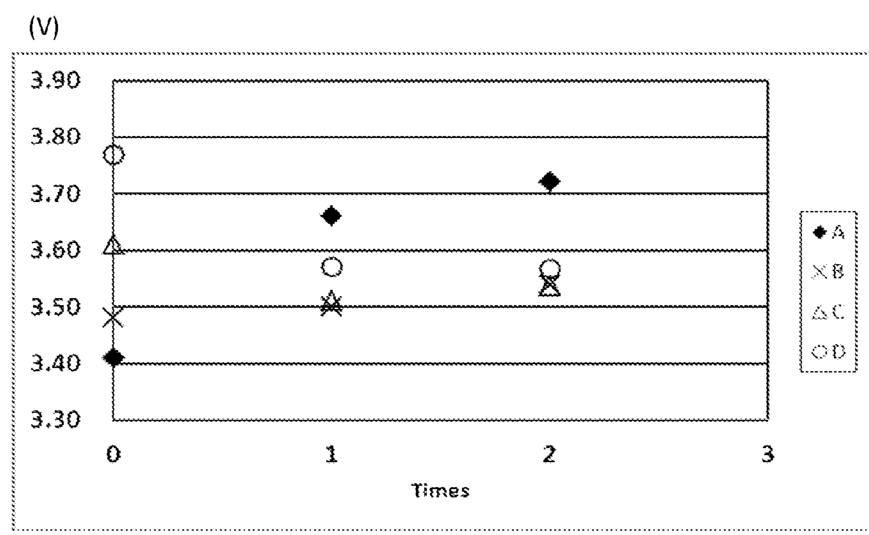
FIG. 7 is a schematic diagram showing the forward voltages of an optoelectronic semiconductor device with the different barrier layer thickness after different annealing cycle times in accordance with a first embodiment of the present application.

In the embodiment of the present application, an optoelectronic semiconductor device is annealed with a temperature greater than 150° C. The X-axis of the FIG. 7 shows the annealing cycle times of the optoelectronic semiconductor device in 260° C., and the Y-axis of the FIG. 7 shows the $V_f$ (the measured voltage when 350 mA is applied to the optoelectronic semiconductor device) of the samples with the different barrier layer thicknesses after different annealing cycle times. The thickness of the barrier layer in Sample A is 0, which means virtually no barrier layer 109 formed on the optoelectronic system 106. The thicknesses of the barrier layers in Sample B, C, D are 10 angstroms, 30 angstroms, and 56 angstroms, respectively. Referring to FIG. 7, Sample A which has no barrier layer has the lowest $V_f$ comparing with other samples with different thicknesses of the barrier layer when samples are not annealed (i.e. annealing cycle times is 0). The contact resistance between the electrode 110 and the optoelectronic system 106 of the optoelectronic semiconductor device is increased as the thickness of the barrier layer 109 increased when samples are not annealed (i.e. annealing cycle times is 0). The $V_f$ of the Samples B is increased when the annealing cycle times increased. Because the barrier layer thickness of the Samples B is too thin to prevent metal such as Al in the electrode 10 from reacting with GaN in the optoelectronic system 106, AlN or AlGaN is formed near an interface between the electrode 110 and the optoelectronic system 106 when Al reacts with GaN. The bandgap of the AlN or AlGaN is higher so it can increase the $V_f$ of the optoelectronic semiconductor device. In the embodiment, Sample B of the optoelectronic semiconductor device has a first forward voltage of 3.49 Volt at the room temperature and a second forward voltage of 3.5 Volt after being annealed one time in 260° C., so the difference between the second forward voltage $V_{f2}$ and the first forward voltage $V_{f1}$ is 0.01 Volt.

The $V_f$ of the Samples C or D is decreased when the annealing cycle times increased. Because the barrier layer thickness of the Samples C and D is thick enough to prevent metal such as Al in the electrode 10 from reacting with GaN in the optoelectronic system 106, AlN or AlGaN is not formed near an interface between the electrode 110 and the optoelectronic system 106. The barrier layer 109 can prevent metal such as Al or Au in the electrode 110 from diffusing into the optoelectronic system 106 so a good contact resistance between the electrode 110 and the optoelectronic system 106 of the optoelectronic semiconductor device is achieved. For example, Sample C of the optoelectronic semiconductor device has a first forward voltage 3.6 Volt at the room temperature and a second forward voltage 3.5 Volt after being annealed one time in 260° C., so the difference between the second forward voltage $V_{f2}$ and the first forward voltage $V_{f1}$ is 0.1 Volt. Sample D of the optoelectronic semiconductor device has a first forward voltage 3.78 Volt at the room temperature and a second forward voltage 3.59 Volt after being annealed one time in 260° C., so the difference between the second forward voltage $V_{f2}$ and the first forward voltage $V_{f1}$ is 0.19 Volt. In other words, the difference between the second forward voltage $V_{f2}$ and the first forward voltage $V_{f1}$ is generally smaller than 0.2 Volt.

Figure 8:
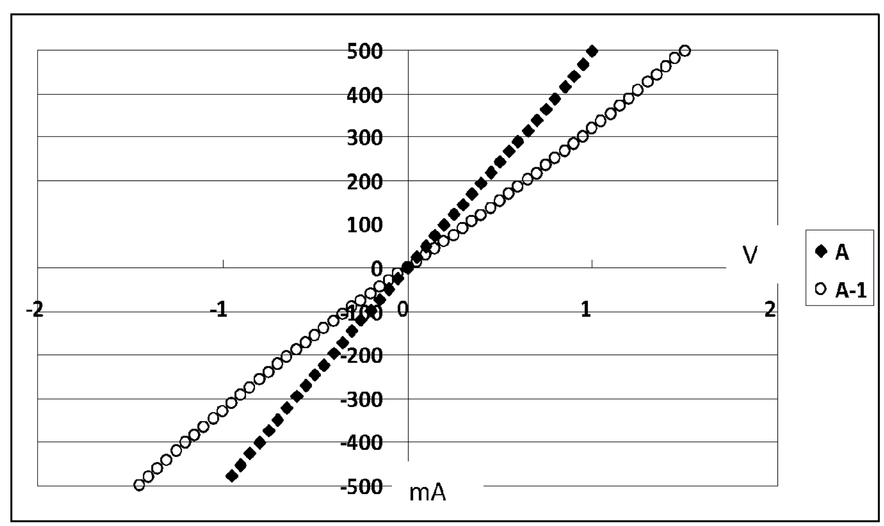
FIG. 8 is a schematic diagram showing an I-V curve of Sample A.
Figure 9:
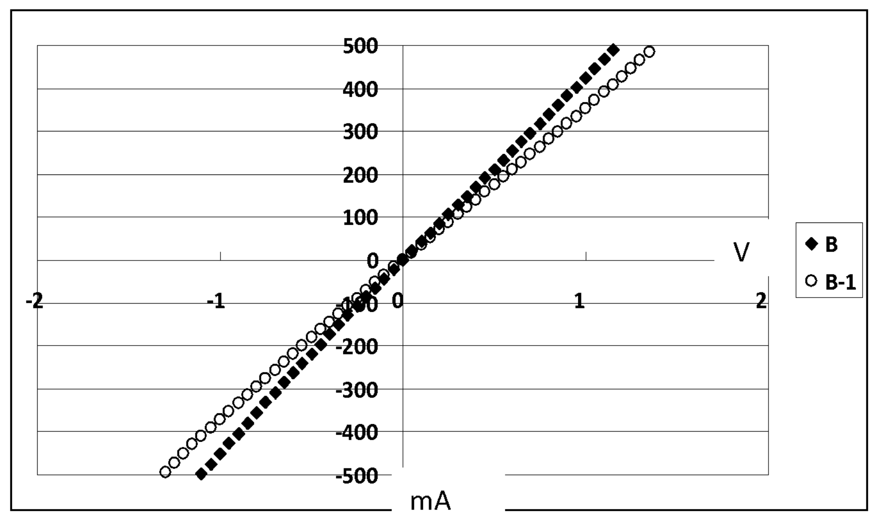
FIG. 9 is a schematic diagram showing an I-V curve of Sample B.
Figure 10:
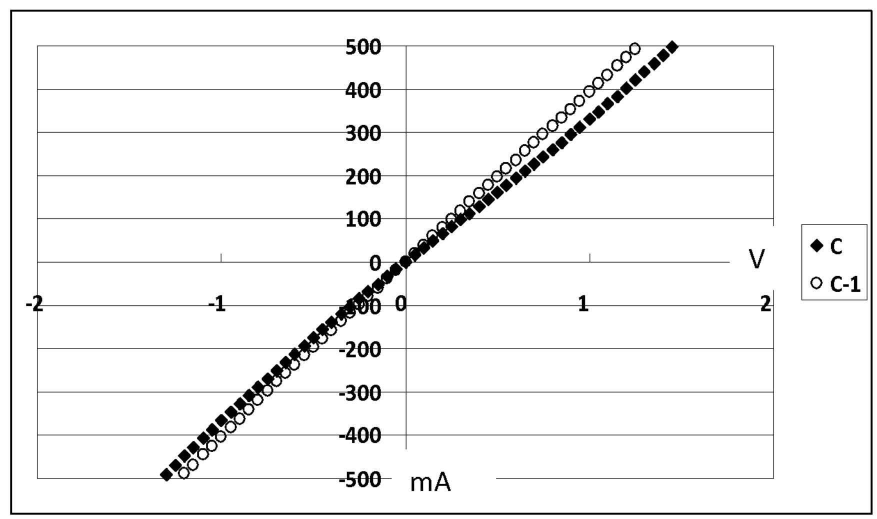
FIG. 10 is a schematic diagram showing an I-V curve of Sample C.
Figure 11:
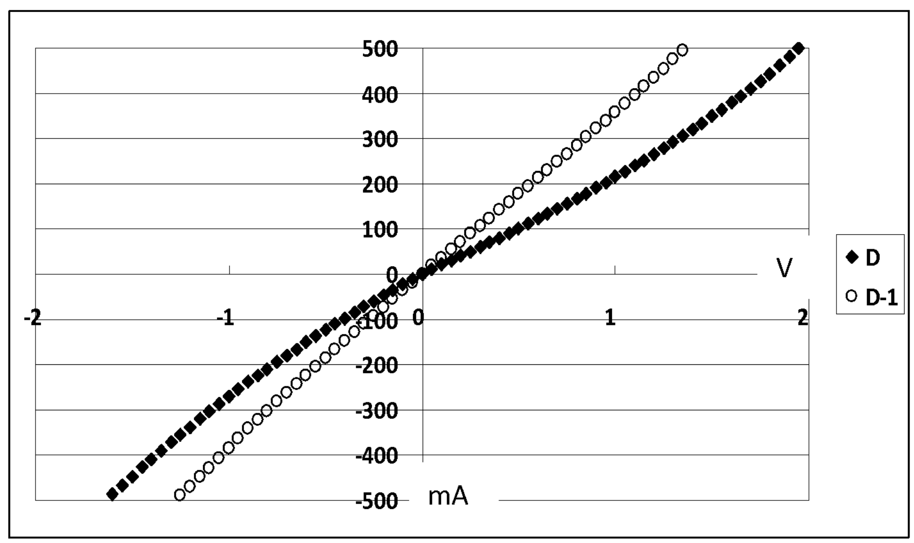
FIG. 11 is a schematic diagram showing an I-V curve of Sample D.

FIG. 8 shows the I-V curve of Sample A with no barrier layer (curve A) and the I-V curve of Sample A with no barrier layer but is annealed in 260° C. (curve A-1). A metal such as Al or Au in the electrode 110 diffuses into the optoelectronic system 106 after annealing, so the contact resistance between the electrode 110 and the optoelectronic system 106 of Sample A with no barrier layer but is annealed in 260° C. is increased. FIG. 9 shows the I-V curve of Sample B which has a barrier layer having a thickness of 10 angstroms (curve B) and the I-V curve of Sample B which has a barrier layer having a thickness of 10 angstroms but is annealed in 260° C. (curve B-1). The thickness of the barrier layer 109 is too thin to prevent the metal such as Al or Au in the electrode 110 from diffusing into the optoelectronic system 106 after annealing so the contact resistance between the electrode 110 and the optoelectronic system 106 of the Sample B which has a barrier layer having a thickness of 10 angstroms but is annealed in 260° C. is increased. FIG. 10 shows the I-V curve of Sample C which has a barrier layer having a thickness of 30 angstroms (curve C) and the I-V curve of Sample C which has a barrier layer having a thickness of 30 angstroms but is annealed in 260° C. (curve C-1). The contact resistance between the electrode 110 and the optoelectronic system 106 of the Sample C which has a barrier layer having a thickness of 30 angstroms but is annealed in 260° C. is decreased. FIG. 11 shows the I-V curve of Sample D which has a barrier layer having a thickness of 56 angstroms (curve D) and the I-V curve of Sample D which has a barrier layer having a thickness of 56 angstroms but is annealed in 260° C. (curve D-1). The contact resistance of between the electrode 110 and the optoelectronic system 106 of the Sample D which has a barrier layer having a thickness of 56 angstroms but is annealed in 260° C. is decreased. The barrier layer thickness of the Samples C or D is thick enough to prevent metal such as Al or Au in the electrode 10 from reacting with GaN in the optoelectronic system 106 after being annealed in 260° C. (curve C-1 and curve D-1). The MN or AlGaN is not formed near an interface between the electrode 110 and the optoelectronic system 106. The barrier layer 109 can prevent metal such as Al or Au in the electrode 110 from diffusing into the optoelectronic system 106 so a good contact resistance between the electrode 110 and the optoelectronic system 106 of the optoelectronic semiconductor device is achieved.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A method of manufacturing an optoelectronic semiconductor device, comprising the steps of:

providing a substrate;

forming an optoelectronic system on the substrate;

forming a barrier layer on the optoelectronic system;

forming an electrode on the barrier layer; and annealing the optoelectronic semiconductor device;

wherein the optoelectronic semiconductor device has a first forward voltage before the annealing step and has a second forward voltage after the annealing step, and a difference between the second forward voltage and the first forward voltage is smaller than 0.2 Volt.

2. The method according to claim 1, further comprising a step of patterning the optoelectronic system to form a sidewall.

3. The method according to claim 2, wherein the method of forming the barrier layer comprises physical vapor phase deposition (PVD).

4. The method according to claim 3, wherein the physical vapor phase deposition (PVD) comprises sputtering deposition.

5. The method according to claim 2, further comprising a step of forming a passivation layer on a sidewall of the optoelectronic system.

6. The method device according to claim 5, wherein the material of the passivation layer comprises single metal oxides, complex oxides, or non-conductive compound nitrides.

7. The method according to claim 6, wherein the material of the passivation layer comprises $SiN_x$.

8. The method according to claim 1, wherein the material of the barrier layer comprises metal nitride.

9. The method according to claim 8, wherein the material of the barrier layer comprises $TiN_x$.

10. The method according to claim 1, wherein the optoelectronic system comprises a first conductivity type layer, a conversion unit, and a second conductivity type layer.

11. The method according to claim 1, wherein the material of the optoelectronic system comprises one or more elements selected from the group consisting of Ga, Al, In, As, P, N, and Si.

12. The method according to claim 1, wherein the step of annealing the optoelectronic semiconductor device is performed at an annealing temperature greater than 150° C.

13. The method according to claim 1, comprising cycling the annealing step more than one time.

14. The method according to claim 1, wherein the first forward voltage and the second forward voltage are measured under a current of 350 mA applied to the optoelectronic semiconductor device.

15. The method according to claim 1, wherein the second forward voltage is lower than the first forward voltage.

16. The method according to claim 1, wherein the thickness of the barrier layer is not less than 10 angstroms.

17. The method according to claim 1, wherein the substrate is conductive.

* * * * *